United States Patent [19]

Okino

[11] Patent Number: 5,798,196
[45] Date of Patent: Aug. 25, 1998

[54] PATTERN TRANSFER METHOD UTILIZING DISTRIBUTION CONDITION EVALUATION BY CHARGED PARTICLE BEAM

[75] Inventor: Teruaki Okino, Kanagawa-ken, Japan

[73] Assignee: Nikon Corporation, Tokyo, Japan

[21] Appl. No.: 673,561

[22] Filed: Jul. 1, 1996

[30] Foreign Application Priority Data

Jul. 5, 1995 [JP] Japan .................................. 7-169609

[51] Int. Cl.⁶ ...................................................... G03F 7/20
[52] U.S. Cl. ............................ 430/30; 430/296; 430/942; 250/492.3
[58] Field of Search ............................ 430/30, 296, 942; 250/492.3

[56] References Cited

U.S. PATENT DOCUMENTS

| | | | |
|---|---|---|---|
| 5,208,124 | 5/1993 | Sporon-Fiedler et al. | 430/296 |
| 5,254,438 | 10/1993 | Owen et al. | 430/296 |
| 5,432,714 | 7/1995 | Chung et al. | 430/296 |
| 5,667,923 | 9/1997 | Kanata | 430/296 |

*Primary Examiner*—Christopher G. Young
*Attorney, Agent, or Firm*—Armstrong, Westernman, Hattori, McLeland & Naughton

[57] ABSTRACT

A pattern transfer method in which a part or all of a plurality of small areas on a mask are sequentially irradiated with a charged particle beam to transfer an image of a pattern provided in each of the irradiated small areas onto a radiation-sensitive substrate, e.g., a wafer. A pattern distribution condition is evaluated for each small area, and an image-formation condition of the pattern image with respect to the radiation-sensitive substrate is adjusted for each small area on the basis of predetermined information including a result of the evaluation.

6 Claims, 5 Drawing Sheets

1

PATTERN TRANSFER METHOD UTILIZING DISTRIBUTION CONDITION EVALUATION BY CHARGED PARTICLE BEAM

BACKGROUND OF THE INVENTION

1. Field of the Invention

The present invention relates to a pattern transfer method and a transfer apparatus which are usable, for example, for lithography to fabricate semiconductor integrated circuits. More particularly, the present invention relates to a technique whereby a pattern on a mask is transferred onto a radiation-sensitive substrate by using a charged particle beam, e.g., an electron beam, an ion beam, etc.

2. Description of the Related Art

In a pattern transfer process that uses a charged particle beam, if the beam current is large, blur caused by Coulomb interaction effect is introduced into a pattern image projected onto a radiation-sensitive substrate (e.g., a wafer as a substrate of a semiconductor integrated circuit). The greater part of the blur caused by Coulomb interaction effect can be corrected by re-adjusting the focus position of the pattern projection lens system. However, a part of the blur caused by Coulomb interaction effect remains uncorrected. There is a variable shaped beam type exposure system in which the cross-sectional configuration of the charged particle beam is varied within a range of about 10 by 10 micrometers square to carry out pattern transfer. In this type of exposure system, blur caused by Coulomb interaction effect is predicted from the area of the shaped beam and system parameters (i.e., the beam current, the beam aperture angle, the beam acceleration voltage, and the optical length of the lens system), and the focus of the lens system is adjusted according to the result of the prediction. Focus adjustment made for the purpose of eliminating blur caused by Coulomb interaction effect may be particularly called "refocusing".

Incidentally, there is a so-called divide transfer type system in which a part or all of a plurality of small areas provided on a mask are sequentially irradiated with a charged particle beam to transfer images of patterns provided in the irradiated small areas onto predetermined positions on a radiation-sensitive substrate. In this type of system, the irradiation range on the radiation-sensitive substrate by a single shot of charged particle beam is from 100 by 100 to 1,000 by 1,000 micrometers square; this is considerably wider than that in the variable shaped beam type system. It has recently been reported that blur caused by Coulomb interaction effect is small when the irradiation range is very wide, as stated above (Particle-Particle Interaction Effects in Image Projection Lithography; S. D. Berger et al; J. Vac. Sci. Technol. B11(6). November/December 1993 p.2294-). This is considered to be a great advantage of the divide transfer type system. That is, when the amount of blur caused by Coulomb interaction effect is restricted within a predetermined value, the divide transfer type system allows use of a larger beam current than in the case of the variable shaped beam type, thus enabling an improvement in the throughput of the transfer process.

However, the divide transfer type system also suffers from some problems. That is, patterns (equivalent to charged particle beam transmitting portions) are not always uniformly distributed over each individual small area on the mask; patterns are distributed in various forms. In a case where patterns particularly concentrate on a limited narrow area in a small area, when pattern transfer is carried out for that small area, the charged particle beam irradiation range on the radiation-sensitive substrate practically narrows, thus increasing blur caused by Coulomb interaction effect. For example, let us consider a case where, as shown in FIGS. 5(a) and 5(b) of the accompanying drawings, small areas A and B which are provided on a mask are each provided with the same number of charged particle beam transmitting patterns PT (hatched portions in the figures) which are equal in both shape and area to each other. In this case, the total areas of the patterns PT in the small areas A and B are the same. However, in the small area B, shown in FIG. 5(b), the charged particle beam concentrates on a narrower area than in the small area A, shown in FIG. 5(a). Accordingly, blur caused by Coulomb interaction effect is greater in the small area B than in the small area A. Therefore, blur caused by Coulomb interaction effect cannot be accurately corrected simply by effecting focus adjustment according to the pattern density (i.e., the total area of transmitting patterns/the area of the small area) for each small area.

SUMMARY OF THE INVENTION

An object of the present invention is to provide a pattern transfer method and a transfer apparatus which are capable of optimizing transfer conditions for each small area on a mask in a divide transfer type pattern transfer process even more effectively, thereby realizing pattern transfer of higher resolution than in the conventional technique.

The present invention provides a pattern transfer method in which a part or all of a plurality of small areas on a mask are sequentially irradiated with a charged particle beam to transfer an image of a pattern provided in each of the irradiated small areas onto a radiation-sensitive substrate. The pattern transfer method includes the step of evaluating a distribution condition of the pattern for each small area, and the step of adjusting an image-formation condition of the pattern image with respect to the radiation-sensitive substrate for each small area on the basis of predetermined information including a result of the evaluation.

In addition, the present invention provides a pattern transfer method in which a part or all of a plurality of small areas on a mask are sequentially irradiated with a charged particle beam to transfer an image of a pattern provided in each of the irradiated small areas onto a radiation-sensitive substrate. The pattern transfer method includes the step of evaluating a density and distribution condition of the pattern for each small area, and the step of adjusting an image-formation condition of the pattern image with respect to the radiation-sensitive substrate for each small area on the basis of predetermined information including a result of the evaluation.

In one embodiment of the present invention, the pattern transfer method further includes the step of adjusting the focused position of a projection optical system for projecting the pattern image onto the radiation-sensitive substrate on the basis of the predetermined information.

In another embodiment of the present invention, the pattern transfer method includes the step of adjusting the focused position of the projection optical system such that, assuming that the density of the pattern provided in each small area is constant, the focused position comes closer to the mask as the deviation of distribution of the pattern increases.

In addition, the present invention provides a charged particle beam transfer apparatus including: an irradiation device for selectively irradiating a plurality of small areas on a mask with a charged particle beam; a projection optical system for leading at least a part of the charged particle beam passing through each of the irradiated small areas on the mask to a radiation-sensitive substrate; an evaluation device for evaluating a distribution condition of a pattern provided on the mask for each small area on the basis of pattern information related to an arrangement of the pattern; and an image-formation control device for adjusting an image-formation condition of an image of the pattern projected onto the radiation-sensitive substrate for each small area on the basis of predetermined information including a result of the evaluation made by the evaluation device.

In one embodiment of the present invention, the image-formation control device adjusts the focused position of the projection optical system for each small area.

In addition, the present invention provides a charged particle beam transfer apparatus including: an irradiation device for selectively irradiating a plurality of small areas on a mask with a charged particle beam; a projection optical system for leading at least a part of the charged particle beam passing through each of the irradiated small areas on the mask to a radiation-sensitive substrate; an evaluation device for evaluating a density and distribution condition of a pattern provided on the mask for each small area on the basis of pattern information related to the arrangement of the pattern; and an image-formation control device for adjusting an image-formation condition of an image of the pattern projected onto the radiation-sensitive substrate for each small area on the basis of predetermined information including a result of the evaluation made by the evaluation device.

In one embodiment of the present invention, the image-formation control device adjusts the focused position of the projection optical system such that, assuming that the density of the pattern provided in each small area is constant, the focused position comes closer to the mask as the deviation of distribution of the pattern evaluated by the evaluation device increases.

In addition, the present invention provides a pattern transfer method in which a mask is irradiated with a charged particle beam to transfer an image of a mask pattern provided in an area irradiated with the charged particle beam onto a radiation-sensitive substrate. The method includes the step of evaluating a distribution condition of the pattern for each area irradiated with the charged particle beam, and the step of adjusting an image-formation condition of the pattern image with respect to the radiation-sensitive substrate on the basis of predetermined information including a result of the evaluation.

In addition, the present invention provides a pattern transfer method in which a plurality of small areas on a mask are sequentially irradiated with a charged particle beam to transfer images of patterns provided in the small areas onto a radiation-sensitive substrate. The method includes: the step of selecting the plurality of small areas according to a predetermined selection sequence; the step of dividing one selected small area into n unit areas; the step of detecting a pattern density for each of the divided unit areas; the step of obtaining a density distribution coefficient in the selected small area by using the pattern density in each unit area; the step of ranking a degree of pattern density in the selected small area and a degree of deviation of pattern distribution in the selected small area according to the density distribution coefficient in the selected small area; the step of judging whether or not the processing at each of the above-described steps has been completed for all the small areas, and carrying out, if there is an unprocessed small area, the processing at each of the steps for the unprocessed small area; and the step of adjusting an image-formation position with respect to the radiation-sensitive substrate of the image of the pattern in each of the ranked small areas by controlling the charged particle beam on the basis of the ranks of the plurality of small areas.

In one embodiment of the present invention, the step of adjusting the image-formation position includes the step of reading the ranks of the plurality of small areas, and the step of determining a refocus quantity according to the read ranks.

In addition, the present invention provides a pattern transfer method in which a charged particle beam is scanned over a mask, and wherein the mask is moved in a direction intersecting a scanning direction of the charged particle beam, and a radiation-sensitive substrate is moved in synchronism with the movement of the mask, thereby transferring an image of a pattern on the mask onto the radiation-sensitive substrate. The method includes the step of setting a plurality of imaginary small areas in a pattern area on the mask; the step of evaluating a distribution condition of the pattern for each of the imaginary small areas; and the step of adjusting an image-formation condition of the pattern image with respect to the radiation-sensitive substrate on the basis of predetermined information including a result of the evaluation.

It should be noted that the expression "the focused position" as used in this specification device the image-formation position of the pattern image when it is assumed that there is no blur caused by Coulomb interaction effect.

In the present invention, the image-formation position of the pattern image can be adjusted by taking into consideration the pattern distribution condition for each small area on the mask.

In the present invention, the image-formation position of the pattern image can be adjusted by taking into consideration the pattern density and pattern distribution condition in each small area.

In the present invention, the focused position of the projection optical system is adjusted for each small area.

In the present invention, the actual focus shifts remoter from the mask than the focused position as the deviation of the pattern in a small area increases. Therefore, if the focused position has previously been brought closer to the mask, the actual focus can be adjusted to the desired position.

In the present invention, the image-formation position of the pattern image can be adjusted by taking into consideration the pattern distribution condition for each charged particle beam irradiation area.

DETAILED DESCRIPTION OF PREFERRED EMBODIMENTS

Figure 1:
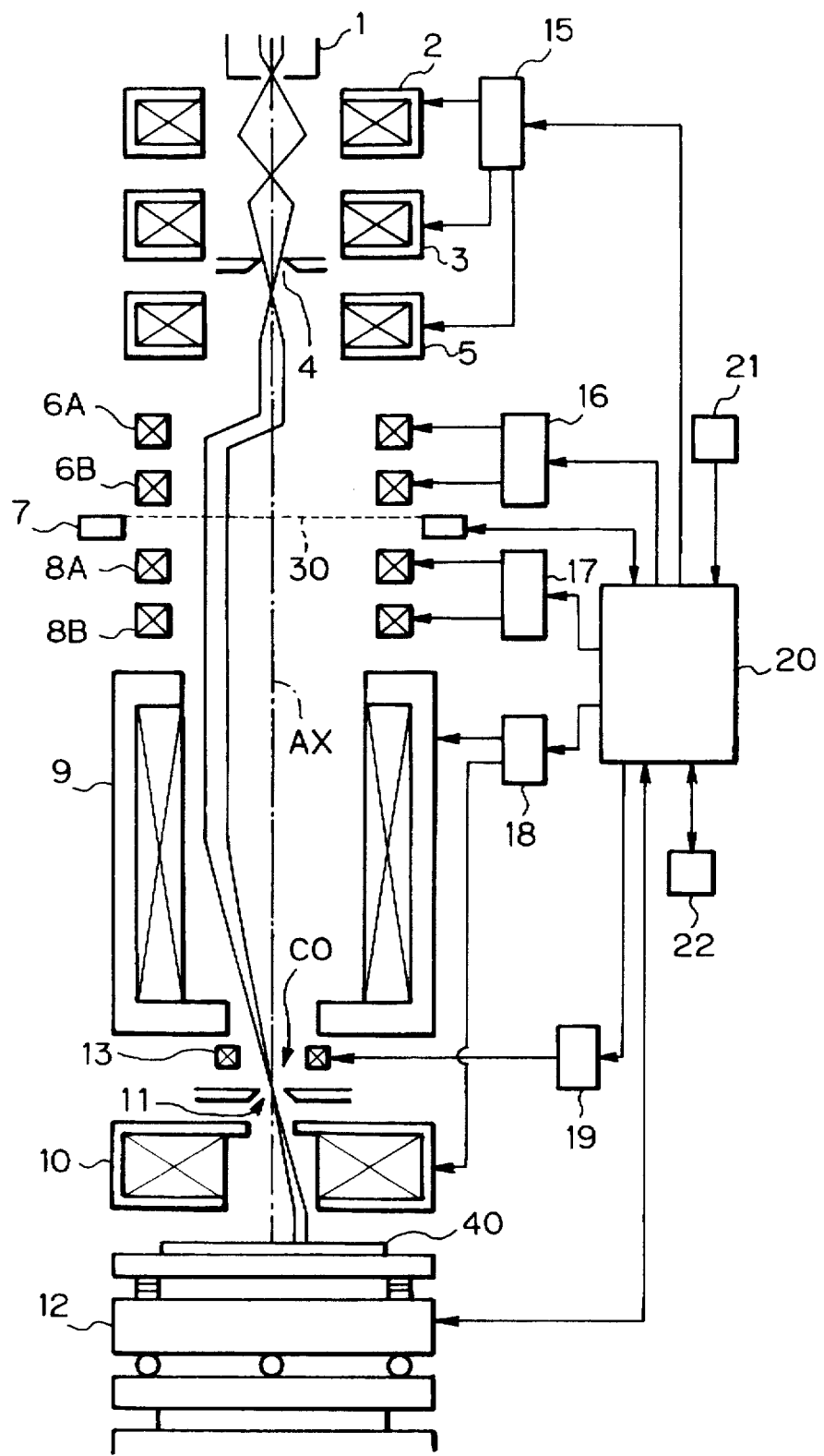
FIG. 1 schematically shows a transfer apparatus according to one embodiment of the present invention.

One embodiment of the present invention will be described below with reference to FIGS. 1 to 4. FIG. 1 schematically shows a transfer apparatus used in the embodiment of the present invention. An electron gun 1 emits an electron beam EB. A pair of condenser lenses 2 and 3 converge the electron beam EB from the electron gun 1. A first aperture 4 shapes the electron beam EB into a beam of a square cross-sectional configuration. A condenser lens 5 converges the electron beam passing through the first aperture 4. A pair of deflectors 6A and 6B deflect the electron beam passing through the condenser lens 5. A mask stage 7 causes a mask 30 to move in a plane perpendicularly intersecting an optical axis AX of the optical system. As shown, for example, in FIG. 2(a), the central portion of the mask 30 is provided with a multiplicity of small areas 31 (one of which is shown by hatching) which are arrayed lengthwise and breadthwise, as shown by the chain lines in the figure. The size of each small area 31 is approximately equal to the cross-sectional size of the electron beam led to the mask 30 from the condenser lens 5 in the transfer apparatus shown in FIG. 1. That is, the size of the small areas 31 is set such that each small area 31 can be irradiated with the electron beam by one shot. A pattern which is to be transferred onto a predetermined area on a wafer 40 (see FIG. 1) as a radiation-sensitive substrate is divided into smaller patterns, and each small area 31 is provided with some of the smaller patterns. It should be noted that illustration of the configuration of each individual pattern is omitted. The number of illustrated small areas 31 is merely an example.

Referring to FIG. 1, a pair of deflectors 8A and 8B deflect the electron beam passing through the mask 30. Projection lenses 9 and 10 project the pattern image of the mask 30 onto the wafer 40 with an appropriate demagnification ratio (e.g., 4:1). A second aperture 11 is provided near the crossover CO where electron beams are caused to cross each other by the projection lens 9. A wafer stage 12 holds the wafer 40 and causes it to move in a plane perpendicularly intersecting the optical axis AX of the optical system. An electron beam that scatters at an angle greater than a predetermined degree when passing through the mask 30 is blocked by the periphery of the second aperture 11 and hence not incident on the wafer 40. An electromagnetic refocusing lens 13 is provided in the vicinity of the second aperture 11. The refocusing lens 13 is a feature of the transfer apparatus according to the embodiment of the present invention.

The transfer apparatus is further provided with a control power supply 15 for the condenser lenses 2, 3 and 5, a control power supply 16 for the deflectors 6A and 6B, a control power supply 17 for the deflectors 8A and 8B, a control power supply 18 for the projection lenses 9 and 10, and a control power supply 19 for the refocusing lens 13. The output currents from the control power supplies 15 to 19 are set according to instructions from a controller 20. The controller 20 also controls the operations of the mask stage 7 and the wafer stage 12. Reference numeral 21 denotes an input unit for inputting various control information to the controller 20, and reference numeral 22 denotes a storage unit for the controller 20.

Figure 3:
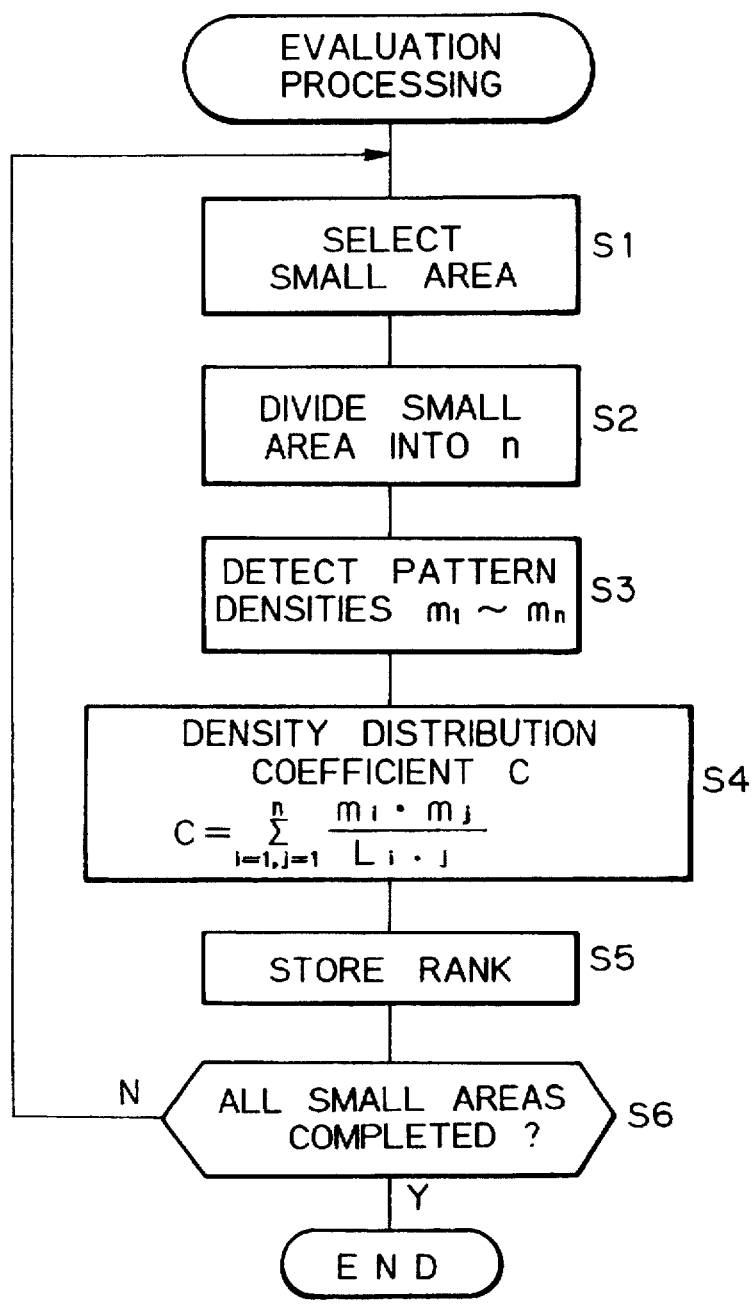
FIG. 3 is a flowchart showing a process of evaluating a pattern density and pattern distribution condition for each small area on a mask in one embodiment of the present invention.

In a preparatory stage prior to a transfer process, mask data unique to the mask 30 is read into the controller 20 from the input unit 21 and stored in the storage unit 22. The mask data include various information necessary for the control of the pattern transfer operation, e.g., the size, position and number of small areas 31, the electron beam irradiation time for each small area 31. Because the mask data is prepared on the basis of design data concerning the mask 30, the mask data can be readily incorporated with pattern information related to a pattern arrangement for each small area 31. Therefore, in the embodiment of the present invention, mask data including the pattern information is supplied to the controller 20, and evaluation processing shown in FIG. 3 is executed by the controller 20 on the basis of the mask data. It is also possible to evaluate mask data by another device and to give only the evaluation result to the controller 20.

Figure 2A:
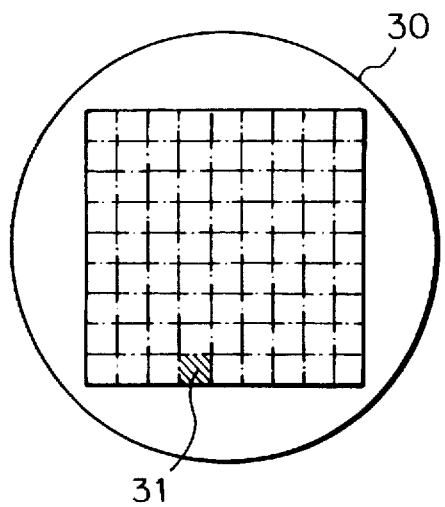
FIGS. 2(a), 2(b) and 2(c) illustrate a process of evaluating a pattern density and pattern distribution condition for each small area on a mask in one embodiment of the present invention.
Figure 2B:
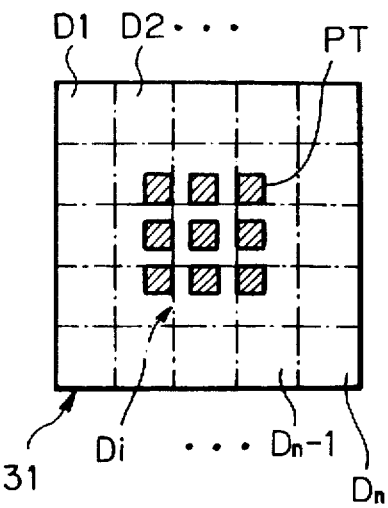
Figure 5A:
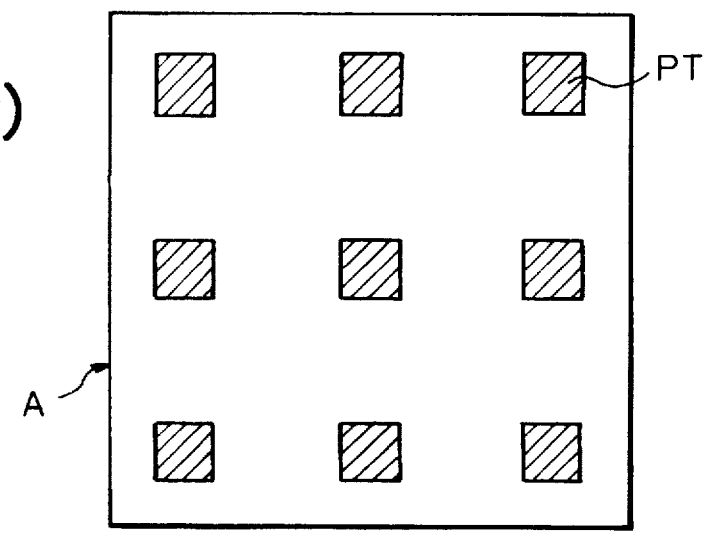
FIGS. 5(a) and 5(b) show examples of pattern distribution in a small area on a mask.
Figure 5B:
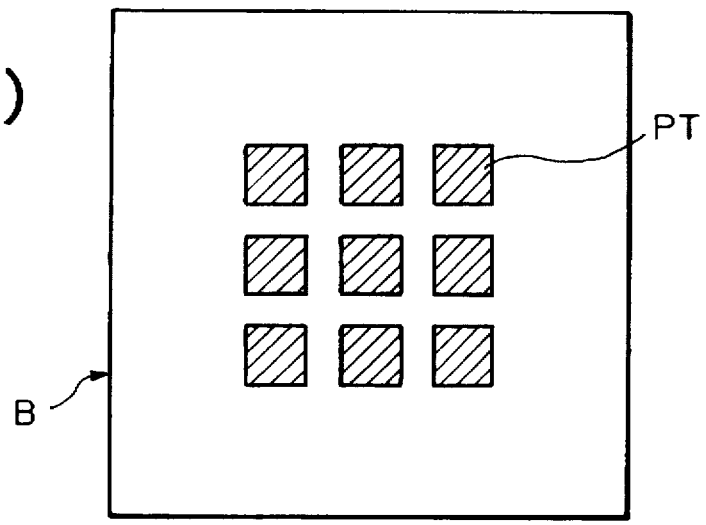

In the evaluation processing shown in FIG. 3, a density distribution coefficient C which indicates a pattern density and pattern distribution condition in each small area 31 is calculated according to the following procedure. First, at step S1, a small area 31 for which a density distribution coefficient C is to be calculated is selected according to a predetermined selection sequence. At the subsequent step S2, the selected small area 31 is divided into n unit areas. FIG. 2(b) shows an example of the division of the selected small area 31. In this example, a small area 31 having patterns PT as shown in FIG. 5(b) is divided into n (n=25) unit areas $D_1, D_2, \ldots, D_n$ by boundaries shown by the chain double-dashed lines in the figure. It should be noted that the patterns PT correspond to charged particle beam transmitting portions which are defined by openings or formed from a thin film which satisfactorily transmits the electron beam. The portion of the small area 31 other than the patterns PT is set so as to absorb or scatter the electron beam to a greater extent than the portions corresponding to the patterns PT.

After the division of the small area 31, the process proceeds to step S3 in FIG. 3. At step S3, pattern densities $m_1$ to $m_n$ are detected with respect to the unit areas $D_1$ to $D_n$ (see FIG. 2(b)) divided at step S2. The value of density $m_i$ in an arbitrary unit area $D_i$ is determined by dividing the total area of patterns PT contained in the unit area $D_i$ by the area of the unit area $D_i$. The two areas necessary for the calculation of the density $m_i$ (i=1 to n) can be obtained from the above-described mask data.

At the subsequent step S4, a density distribution coefficient C is obtained from the following expression (1):

$$C = \sum_{i=1, j=1}^{n} \frac{m_i \cdot m_j}{L_{i,j}} \quad (1)$$

where $m_i$ and $m_j$ are densities detected at step S3 with respect to arbitrary unit areas $D_i$ and $D_j$, and $L_{i,j}$ is the distance between the unit areas $D_i$ and $D_j$.

Figure 2C:
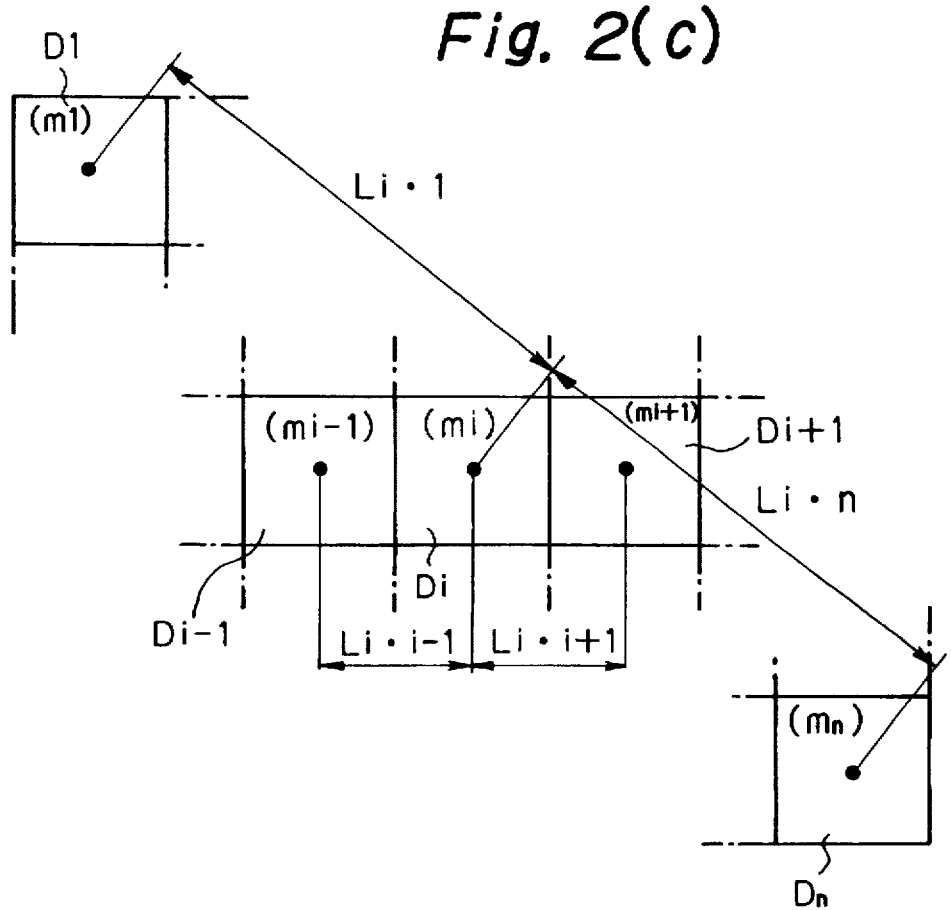

For example, as shown in FIG. 2(c), the distances between the unit area $D_i$ and the unit areas $D_{i,1-1}$ and $D_{i+1}$, which are adjacent to the unit area $D_i$, are $L_{i,i-1}$ and $L_{i,i+1}$, respectively. The distance between the unit areas $D_i$ and $D_j$ is $L_{i,j}$, and the distance between the unit areas $D_i$ and $D_n$ is $L_{i,n}$. When i=j, $L_{i,j}=0$, and processing is executed with $m_i \cdot m_j / L_{i,j}$ regarded as zero. According to the expression (1), the higher the pattern density in the small area 31, the larger the density distribution coefficient C. For the same pattern density, the density distribution coefficient C becomes larger as the degree to which the patterns concentrate on a specific position in the small area 31 increases.

After the calculation of the density distribution coefficient C, the process proceeds to step S5 in FIG. 3. At step S5, the degree of pattern density and the degree of deviation of the pattern distribution in the small area 31 presently selected are ranked according to the magnitude of the density distribution coefficient C obtained at step S5, and the result of the ranking is stored in the storage unit 22. At the subsequent step S6, it is judged where or not the processing at steps S2 to S5 has been completed for all the small areas 31. If there is any unprocessed small area 31, the process returns to step S1 to select an unprocessed small area 31. Upon completion of the above-described processing for all the small areas 31, the evaluation processing shown in FIG. 3 is terminated.

During the transfer process, the controller 20 controls the output currents from the control power supplies 15 to 19 and the operations of the mask and wafer stages 7 and 12 according to the mask data held in the storage unit 22, thereby allowing an electron beam to be applied to each small area 31 on the mask 30 for a predetermined time. Thus, the pattern images of the small areas 31 are sequentially projected and transferred onto predetermined positions on the wafer 40. In this case, the focus of the projection lenses 9 and 10, that is, the output current from the control power supply 18, is set such that, no matter which small area 31 has been selected as an object of electron beam irradiation, an in-focus image of a pattern provided in the small area 31 is projected onto the wafer 40 on the assumption that the small area 31 is provided with a standard pattern. Each time small areas 31 to be irradiated with the electron beam are changed from one to another, the controller 20 executes refocus setting processing as shown in FIG. 4 to correct blur caused by Coulomb interaction effect due to the difference in pattern configuration between the small areas 31.

Figure 4:
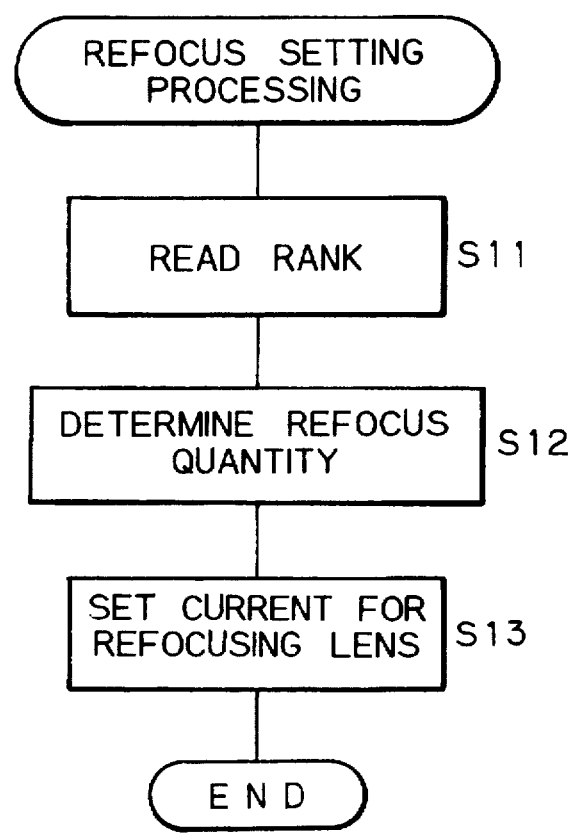
FIG. 4 is a flowchart showing a process of refocusing for each small area in one embodiment of the present invention.

In the processing shown in FIG. 4, first, the rank of the small area 31 presently selected as an object of electron beam irradiation is read from the storage unit 22 at step S11. The rank of the small area 31 has been obtained by the processing shown in FIG. 3. Next, at step S12, a refocus quantity (i.e., an amount of focus adjustment made by the refocusing lens 13) is determined according to a predetermined table. The table has previously been prepared by a computer simulation or an experiment and given to the storage unit 22. Blur caused by Coulomb interaction effect increases as the pattern density or pattern deviation in a small area 31 increases, causing the image-formation position of the pattern image to shift away from the mask 30. Therefore, for a small area 31 of higher rank, i.e., having a higher degree of pattern density or deviation, a refocus quantity is determined such that the image-formation position of the pattern image comes closer to the mask 30 than the position where the pattern image is formed by the projection lenses 9 and 10 only. At the subsequent step S13, an electric current to be given to the control power supply 19 is set according to the determined refocus quantity. Thus, the processing is terminated.

After the excitation of the refocusing lens 13 has been adjusted in conformity to the small area 31 selected as an object of electron beam irradiation, the small area 31 is irradiated with the electron beam, and thus the pattern image of the small area 31 is transferred onto a predetermined position on the wafer 40. It should be noted that the electron beam irradiation position on the mask 30 is controlled by the amount of deflection made by the deflectors 6A and 6B and the position of the mask stage 7. The pattern image transfer position on the wafer 40 is controlled by the amount of deflection made by the deflectors 8A and 8B and the position of the wafer stage 12. It should be noted that, during the above-described transfer process, one small area 31 on the mask 30 may be irradiated with the electron beam two or more times. Alternatively, the electron beam may be applied to one or more small areas 31 selected from among a plurality of small areas 31.

In the above-described embodiment: the wafer 40 forms a radiation-sensitive substrate; a combination of the projection lenses 9 and 10 and the refocusing lens 13 forms a projection optical system; a combination of the electron gun 1, the condenser lenses 2, 3 and 5, the first aperture 4, the deflectors 6A and 6B, and the mask stage 7 forms an irradiation device; the controller 20 which executes the processing shown in FIG. 3 forms an evaluation device; and the controller 20 which executes the processing shown in FIG. 4 forms an image formation control device.

Although in the foregoing embodiment the calculation of the density distribution coefficient C and the ranking process are executed by the controller 20 attached to the transfer apparatus, these processing operations may be carried out by using another arithmetic unit, e.g., a computer for mask design. It is also possible to calculate an optimum refocus quantity for each small area from the mask design data without executing the calculation of the density distribution coefficient C or the ranking process. When the pattern density in each small area can be regarded as approximately constant, only a pattern distribution deviation may be evaluated for each small area without taking into consideration the pattern density. A correct refocus quantity may be previously measured for each small area by the mark edge detecting method. When there is a parameter concerning the focus adjustment in addition to the pattern density and distribution condition, the parameter may also be taken into consideration when focus adjustment is made. Although in the described embodiment of the present invention the image-formation position of the pattern image is adjusted by using the refocusing lens 13, the excitation of the projection lenses 9 and 10 may be adjusted to effect refocusing. However, higher responsibility can be obtained by adjusting the refocusing lens 13 than by adjusting the current supplied to the projection lenses 9 and 10 because the refocusing lens 13 requires focus adjustment to be made in a much narrower range than in the case of the projection lenses 9 and 10. Further, any device capable of adjusting the image-formation position of the pattern image can be properly used in addition to a device for adjusting the focus of the projection optical system. For example, the height of the wafer 40 in the direction of the optical axis may be adjusted for each small area by providing the wafer stage 12 with a mechanism for position adjustment in the optical axis direction.

Although in the above-described embodiment each small area 31 on the mask 30 is irradiated in its entirety by one shot of electron beam, the present invention can also be applied to a transfer method in which the cross-sectional size of the electron beam on the mask 30 is set smaller than each small area 31, and deflection scanning of the electron beam is carried out in each small area 31.

Figure 6:
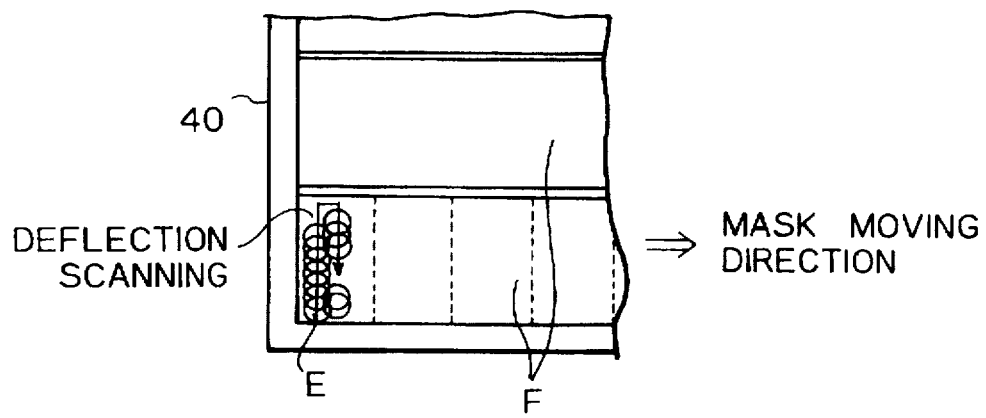
FIG. 6 illustrates a process of evaluating a pattern distribution condition in another embodiment of the present invention.

In the foregoing description, the present invention is applied to a case where the mask 30 is physically divided into a plurality of small areas 31 by boundary areas (also known as "struts" or "skirts"; not shown in the figure), which scatter or absorb the charged particle beam, and where a pattern distribution condition is evaluated for each small area 31, and the image-formation condition of the pattern image is adjusted on the basis of the evaluation. However, the present invention is also applicable to a transfer method or a transfer apparatus which uses a mask that has no such boundary areas and that is not physically divided into small areas. More specifically, as shown in FIG. 6, the present invention can also be applied to a method or apparatus in which an image of a pattern on a mask 40 is transferred onto a radiation-sensitive substrate by carrying out one-dimensional deflection scanning of a charged particle beam over the mask 40 (i.e., deflection scanning in one direction), and synchronously moving the mask 40 and the radiation-sensitive substrate in a direction intersecting the one-dimensional scanning direction (e.g., at right angles). In this case, the image-formation condition is adjusted as follows: A pattern distribution condition is evaluated for each charged particle beam irradiation area E (e.g., a circular area in FIG. 6), and the image-formation condition is adjusted on the basis of the evaluation. Alternatively, each pattern area F on the mask 40 is divided into a plurality of imaginary small areas (as shown for example by the dotted lines in FIG. 6), and a pattern distribution condition in each imaginary small area is evaluated. Then, the image-formation condition is adjusted on the basis of the evaluation. In the latter case, each pattern area on the mask 40 may be divided along either the charged particle beam scanning direction or the mask moving direction. Further, in this case, the accuracy can be improved by increasing the number of imaginary small areas.

As has been described above, in the present invention, the image-formation condition of the pattern image is adjusted by taking into consideration the pattern distribution for each small area on the mask. Accordingly, transfer conditions for each small area can be optimized even more effectively than in the conventional technique, and pattern transfer of higher resolution can be realized. Further, according to the present invention, the image-formation condition of the pattern image is adjusted by taking into consideration the pattern density in each small area in particular. Therefore, pattern transfer of higher resolution can be realized. In addition, according to the present invention, the image-formation condition of the pattern image is adjusted by adjusting the focused position of the projection optical system. Therefore, the image-formation condition of the pattern image can be adjusted by a simple arrangement, and blur caused by Coulomb interaction effect can be effectively corrected.

In addition, according to the present invention, the image-formation condition of the pattern image is adjusted by taking into consideration the pattern distribution for each charged particle beam irradiation area. Therefore, transfer conditions for each irradiation area can be optimized even more effectively than in the conventional technique, and pattern transfer of higher resolution can be realized.

What is claimed is:

1. A pattern transfer method wherein a part or all of a plurality of small areas on a mask are sequentially irradiated with a charged particle beam to transfer an image of a pattern provided in each of the irradiated small areas onto a radiation-sensitive substrate, said method comprising the steps of:

evaluating a distribution condition of said pattern for each of said small areas; and adjusting a focused position of a projection optical system for projecting said pattern image onto said radiation-sensitive substrate for each of said small areas on the basis of predetermined information including a result of the evaluation.

2. A pattern transfer method according to claim 1, wherein the step of adjusting a focused position of a projection optical system for projecting said pattern image onto said radiation-sensitive substrate is performed in a manner such that, assuming that a density of the pattern provided in each of said small areas is constant, the focused position comes closer to said mask as a deviation of distribution of said pattern increases.

3. A pattern transfer method wherein a part or all of a plurality of small areas on a mask are sequentially irradiated with a charged particle beam to transfer an image of a pattern provided in each of the irradiated small areas onto a radiation-sensitive substrate, said method comprising the steps of:

evaluating a density and distribution condition of said pattern for each of said small areas; and adjusting a focused position of a projection optical system for projecting said pattern image onto said radiation-sensitive substrate for each of said small areas on the basis of predetermined information including a result of the evaluation.

4. A pattern transfer method wherein a mask is irradiated with a charged particle beam to transfer an image of a mask pattern provided in an area irradiated with said charged particle beam onto a radiation-sensitive substrate, said method comprising the steps of:

evaluating a distribution condition of said pattern for each area irradiated with said charged particle beam; and adjusting a focused position of a projection optical system for projecting said pattern image onto said radiation-sensitive substrate on the basis of predetermined information including a result of said evaluation.

5. A pattern transfer method wherein a plurality of small areas on a mask are sequentially irradiated with a charged particle beam to transfer image of patterns provided in said small areas onto a radiation-sensitive substrate, said method comprising the steps of:

selecting said plurality of small areas according to a predetermined selection sequence;

dividing one selected small area into n unit areas;

detecting a pattern density for each of said divided unit areas;

obtaining a density distribution coefficient in said selected small area by using said pattern density in each of said unit areas;

ranking a degree of pattern density in said selected small area and a degree of deviation of pattern distribution in said selected small area according to the density distribution coefficient in said selected small area;

judging whether or not processing at each of said steps has been completed for all the small areas, and carrying out, if there is an unprocessed small area, the processing at each of said steps for said unprocessed small area;

reading the ranks of said plurality of small areas; and determining a refocus quantity of an image-formation position with respect to said radiation-sensitive substrate of the image of the pattern in each of said ranked small areas by controlling the charged particle beam according to said read ranks.

6. A pattern transfer method wherein a charged particle beam is scanned over a mask, and wherein said mask is moved in a direction intersecting a scanning direction of said charged particle beam, and a radiation-sensitive substrate is moved in synchronism with the movement of said mask, thereby transferring an image of a pattern on said mask onto said radiation-sensitive substrate, said method comprising the steps of:

setting a plurality of imaginary small areas in a pattern area on said mask;

evaluating a distribution condition of said pattern for each of said imaginary small areas; and adjusting a focused position of a projection optical system for projecting said pattern image onto said radiation-sensitive substrate on the basis of predetermined information including a result of said evaluation.

* * * * *